(12) United States Patent
Bai et al.

(10) Patent No.: US 9,909,040 B2
(45) Date of Patent: Mar. 6, 2018

(54) EPHEMERAL BONDING

(71) Applicants: Rohm and Haas Electronic Materials LLC, Marlborough, MA (US); Dow Global Technologies LLC, Midland, MI (US)

(72) Inventors: Zhifeng Bai, Midland, MI (US); Mark S. Oliver, Charlestown, MA (US); Michael K. Gallagher, Hopkinton, MA (US); Christopher J. Tucker, Midland, MA (US); Karen R. Brantl, West Springfield, MA (US); Elissei Iagodkine, Marlborough, MA (US); Zidong Wang, Southborough, MA (US)

(73) Assignees: Rohm and Haas Electronic Materials LLC, Marlborough, MA (US); Dow Global Technologies LLC, Midland, MI (US)

( * ) Notice: Subject to any disclaimer, the term of this patent is extended or adjusted under 35 U.S.C. 154(b) by 163 days.

(21) Appl. No.: 14/992,251

(22) Filed: Jan. 11, 2016

(65) Prior Publication Data
US 2016/0122601 A1  May 5, 2016

Related U.S. Application Data

(62) Division of application No. 14/069,348, filed on Oct. 31, 2013, now Pat. No. 9,315,696.

(51) Int. Cl.
*C08L 71/02* (2006.01)
*C09J 11/08* (2006.01)
(Continued)

(52) U.S. Cl.
CPC .............. *C09J 143/04* (2013.01); *B32B 7/06* (2013.01); *B32B 7/12* (2013.01); *C08K 5/06* (2013.01);
(Continued)

(58) Field of Classification Search
None
See application file for complete search history.

(56) References Cited

U.S. PATENT DOCUMENTS

| 4,661,193 A | 4/1987 | Kirchhoff et al. |
| 6,559,215 B2 | 5/2003 | Mills et al. |

(Continued)

FOREIGN PATENT DOCUMENTS

| JP | 2008255270 | 10/2008 |
| JP | 2011168663 | 9/2011 |

(Continued)

OTHER PUBLICATIONS

Chauffaille et al, "Pre-cracking behavior in the single cantilever beam adhesion test", Int J Fract, 2011, pp. 133-144, vol. 169.

(Continued)

*Primary Examiner* — Richard A Huhn
(74) *Attorney, Agent, or Firm* — S. Matthew Cairns

(57) ABSTRACT

Compositions containing an adhesive material, a release additive and a compatibilizer are suitable for temporarily bonding two surfaces, such as a wafer active side and a substrate. These compositions are useful in the manufacture of electronic devices where a temporary bonding of a component to a substrate is desired.

18 Claims, 3 Drawing Sheets

(51) Int. Cl.
- *C09J 143/04* (2006.01)
- *C09J 5/06* (2006.01)
- *H01L 21/683* (2006.01)
- *B32B 7/06* (2006.01)
- *B32B 7/12* (2006.01)
- *C08K 5/06* (2006.01)
- *C09J 171/02* (2006.01)
- *C09J 125/18* (2006.01)

(52) U.S. Cl.
CPC ........... *C09J 5/06* (2013.01); *C09J 171/02* (2013.01); *H01L 21/6835* (2013.01); *C08L 71/02* (2013.01); *C09J 11/08* (2013.01); *C09J 125/18* (2013.01); *C09J 2471/00* (2013.01); *H01L 2221/6834* (2013.01); *H01L 2221/68318* (2013.01); *H01L 2221/68327* (2013.01); *H01L 2221/68381* (2013.01); *Y10T 156/10* (2015.01); *Y10T 428/2848* (2015.01)

(56) References Cited

U.S. PATENT DOCUMENTS

| | | |
|---|---|---|
| 7,482,249 B2 | 1/2009 | Jakob et al. |
| 7,713,835 B2 | 5/2010 | Pillalamarri |
| 7,759,050 B2 | 7/2010 | Kessel et al. |
| 7,883,991 B1 | 2/2011 | Wu et al. |
| 8,092,628 B2 | 1/2012 | Hong et al. |
| 8,349,706 B2 | 1/2013 | Noda |
| 2003/0096904 A1* | 5/2003 | Hakuta ............ B32B 17/10302 524/588 |
| 2003/0150557 A1 | 8/2003 | Sezi et al. |
| 2004/0121618 A1 | 6/2004 | Moore |
| 2008/0090380 A1 | 4/2008 | Gardner et al. |
| 2008/0020001 A1 | 8/2008 | Pillalamarri et al. |
| 2009/0017323 A1 | 1/2009 | Webb et al. |
| 2009/0176349 A1 | 7/2009 | Jakob et al. |
| 2009/0233033 A1 | 9/2009 | Griswold |
| 2009/0314417 A1* | 12/2009 | Sasaki ................ C09J 7/0217 156/154 |
| 2010/0038035 A1 | 2/2010 | Noda et al. |
| 2010/0043608 A1 | 2/2010 | Jakob |
| 2010/0263794 A1 | 10/2010 | George et al. |
| 2011/0263095 A1 | 10/2011 | Takeuchi et al. |
| 2011/0272092 A1 | 11/2011 | Richter |
| 2011/0318938 A1 | 12/2011 | Takeuchi et al. |
| 2012/0013013 A1 | 1/2012 | Sadaka et al. |
| 2012/0028438 A1 | 2/2012 | Richter |
| 2012/0034437 A1 | 2/2012 | Puligadda et al. |
| 2013/0192754 A1 | 8/2013 | Dukkipati et al. |
| 2015/0034238 A1* | 2/2015 | Dronen ............ H01L 21/67092 156/247 |
| 2015/0299534 A1* | 10/2015 | Yoshioka ............ B32B 38/10 156/712 |
| 2016/0049324 A1* | 2/2016 | Yamaguchi ............ C08L 33/08 257/618 |

FOREIGN PATENT DOCUMENTS

| | | |
|---|---|---|
| WO | 2006093639 | 8/2006 |
| WO | 2009003029 A2 | 12/2008 |
| WO | 2011100030 A1 | 8/2011 |
| WO | 2013013986 | 1/2013 |
| WO | 2013142054 A1 | 9/2013 |

OTHER PUBLICATIONS

Wimplinger et al, "Equipment and process solutions for low cost high volume manufacturing of 3D integrated devices," Pan Pacific Symposium Conference Proceedings, Feb. 14, 2012.

Chris Rosenthal, "Room temperature mechanical lift off debanding the next step in temporary wafer handling for 3D IC", Chip Scale Review, Jan./Feb. 2012, pp. 26-27.

Search report for corresponding China Application No. 201410849043.7 dated Dec. 27, 2016.

Search Report for corresponding Taiwan Application No. 103137771, dated Feb. 5, 2016.

* cited by examiner

EPHEMERAL BONDING

This application is a divisional of application Ser. No. 14/069,348, filed on Oct. 31, 2013.

The present invention relates to the field of semiconductor manufacture, and more particularly to the temporary bonding of a semiconductor wafer to a substrate.

In many areas of manufacturing, parts to be worked on (processed) must be temporarily attached to another work piece or a support. For example, in the manufacture of semiconductor devices it is often necessary to support semiconductor wafers for various manufacturing steps. The requirement for thinner die packages has driven semiconductor manufacturers to thin semiconductor wafers. Such thinning is typically accomplished by temporarily adhering the front side of a semiconductor wafer, which contains active devices, to a carrier (support) in order to allow for grinding of the backside of the wafer. Also, thinned wafers may be subject to further processing operations, such as metallization, cleaning, etching, and the like. After such processing, the thinned wafer must be detached (debonded) from the carrier. If the temporary adhesive bonds too strongly to the wafer, the wafer may suffer damage, such as breakage, or deformation of bonding features, during separation from the carrier. Alternatively, the temporary adhesive may lack sufficient bulk strength and remain on both the active surface of the wafer and on the substrate after separation requiring additional cleaning or etching steps.

Conventional temporary bonding adhesives used in the manufacture of semiconductor devices are either thermoplastic adhesives or crosslinking adhesives. Thermoplastic adhesives have the advantage that residual adhesive can be easily removed by solvent cleaning. A major problem with thermoplastic adhesives is that they become soft when heated which limits their use in certain applications. Crosslinking adhesives are not easily removed by solvent cleaning and are typically removed by peeling either during or after the debonding operation. This peeling step requires the crosslinking adhesives to have some degree of softness at room temperature. Unfortunately, this room temperature softness is problematic as it provides challenges in achieving uniform wafer thicknesses after a grinding operation.

U.S. patent application Ser. No. 13/661,025, filed on Oct. 25, 2012, addresses many of the above described problems. This patent application discloses a process of disposing a layer of a temporary bonding composition comprising a curable adhesive material and a release additive between the active (device) side of a semiconductor wafer and the attachment surface of a carrier substrate; followed by curing the adhesive material to provide a temporary bonding layer disposed between the active side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the active side of the semiconductor wafer comprises a relatively higher amount of the release additive. Upon curing of the adhesive material, the release additive phase separates toward the active surface of the semiconductor wafer, enabling low-force mechanical debonding at room temperature. As the height and density of the interconnect features on the device side of a semiconductor wafer increases, the amount of release additive present in these temporary bonding compositions must also increase in order to provide a sufficiently thicker release layer at the device wafer surface. However, certain release additives, such as ethyleneoxide-containing polymers, have limited solubility in adhesive materials used, which makes the use of this approach with taller and denser interconnect features challenging.

Accordingly, there remains a need in the industry for temporary bonding adhesives that are easy to apply, are easily removable, do not deform the active side of a wafer, can be used in higher temperature operations than current temporary adhesives, and can be used with increasingly taller and denser interconnect features.

The present invention provides a method of releasably attaching a semiconductor wafer to a carrier substrate comprising: (a) providing a semiconductor wafer having a front side and a back side; (b) providing a carrier substrate having an attachment surface; (c) disposing a temporary bonding composition comprising a curable adhesive material, a release additive and a compatibilizer between the front side of the semiconductor wafer and the attachment surface of the carrier substrate; and (d) curing the adhesive material to provide a temporary bonding layer disposed between the front side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive.

Also provided by the present invention is a structure comprising: a semiconductor wafer having a front side and a back side; a carrier substrate having an attachment surface; and a temporary bonding layer disposed between the front side of the semiconductor wafer and the attachment surface of the carrier substrate; wherein the temporary bonding layer comprises a cured adhesive material, a compatibilizer and a release additive; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive. Preferably, the compatibilizer does not form a separate phase and substantially remains in the cured adhesive material.

Further, the present invention provides a temporary bonding composition comprising a curable adhesive material, a release additive, and a compatibilizer. This temporary bonding composition may be a solution or an emulsion, and is preferably a solution. The release additive is non-curable under the conditions employed to cure the adhesive material. The release additive is selected such that it is soluble or dispersible in the uncured adhesive material, but phase separates during curing of the adhesive material. The compatibilizer is non-curable under the conditions employed to cure the adhesive material, and is selected such that it increases the amount of the release additive that can be dissolved or dispersed in the adhesive material.

It has been surprisingly found that the present invention addresses one or more of the deficiencies in conventional temporary bonding approaches used in the semiconductor industry. The present invention is effective in temporarily bonding a semiconductive wafer to a substrate (carrier) during certain processing steps. The wafer is then debonded from the substrate with reduced, preferably no, deformation of features, and reduced, preferably no, residual adhesive remaining on the active side of the wafer as compared to conventional temporary bonding adhesives. The present invention is particularly suitable for use in the processing of semiconductor wafers, or in any other application where a temporary bond is required.

Figure 1A:
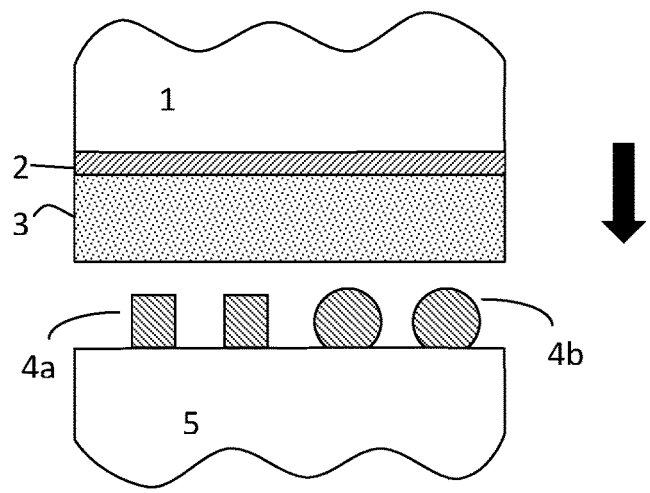
FIGS. 1A-1C are schematic diagrams illustrating the process of the invention.

In the figures, like numerals refer to like elements. It will be understood that when an element is referred to as being "adjacent to" another element, it can be directly adjacent to the other element or intervening elements may be present therebetween. When an element is referred to as being "directly adjacent to" another element, there are no intervening elements. The term "and/or" includes any and all combinations of one or more of the associated listed items.

It will be understood that although the terms first, second, third, etc. may be used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the present invention.

As used throughout this specification, the following abbreviations shall have the following meanings, unless the context clearly indicates otherwise: ° C.=degrees Celsius; g=grams; mg=milligrams; L=liter; ppm=parts per million; μm=micron=micrometers; nm=nanometers; mm=millimeters; mL=milliliters; kPa=kilopascals; GPa=gigapascals; and Mn=number average molecular weight. All amounts are percent by weight and all ratios are molar ratios, unless otherwise noted. All numerical ranges are inclusive and combinable in any order, except where it is clear that such numerical ranges are constrained to add up to 100%. "Wt %" refers to percent by weight, based on the total weight of a referenced composition, unless otherwise noted.

As used throughout the specification, "feature" refers to the geometries on a substrate, and particularly on a semiconductive wafer. The term "alkyl" includes linear, branched and cyclic alkyl. Likewise, "alkenyl" refers to linear, branched and cyclic alkenyl. "Aryl" refers to aromatic carbocycles and aromatic heterocycles. "(Meth)acrylic" refers to both "acrylic" and "methacrylic". By the term "curing" is meant any process, such as polymerization or condensation, that increases the molecular weight of a material or composition. "Curable" refers to any material capable of being cured (polymerized) under certain conditions. The term "oligomer" refers to dimers, trimers, tetramers and other relatively low molecular weight materials that are capable of further curing. The articles "a", "an" and "the" refer to the singular and the plural.

It has been found that an adhesive composition comprising a curable adhesive material, a release additive and a compatibilizer may be used to form an ephemeral (or temporary) bonding layer. In use, the present adhesive composition is first disposed between a substrate (carrier) surface and a surface of a component, the composition is then cured, and various operations may then be performed on the component, after which the component is separated from the carrier.

In particular, the present invention provides a method of releasably attaching a semiconductor wafer to a carrier substrate comprising: (a) providing a semiconductor wafer having a front side and a back side; (b) providing a carrier substrate having an attachment surface; (c) disposing a temporary bonding composition comprising a curable adhesive material, a release additive and a compatibilizer between the front side of the semiconductor wafer and the attachment surface of the carrier substrate; and (d) curing the adhesive material to provide a temporary bonding layer disposed between the front side of the semiconductor wafer and the attachment surface of the carrier substrate; wherein the temporary bonding layer adjacent to the attachment surface of the carrier substrate comprises a relatively lower amount of the release additive and the temporary bonding layer adjacent to the front side of the semiconductor wafer comprises a relatively higher amount of the release additive.

A wide variety of semiconductor wafers may be employed in the present invention. As used herein, the term "semiconductor wafer" is intended to encompass "an electronic device substrate," "a semiconductor substrate," "a semiconductor device," and various packages for various levels of interconnection, including a single-chip wafer, multiple-chip wafer, packages for various levels, substrates for light emitting diodes (LEDs), or other assemblies requiring solder connections. Particularly suitable substrates are glass, sapphire, silicate materials, silicon nitride materials, silicon carbide materials, and patterned wafers, such as patterned silicon wafers, patterned gallium-arsenide wafers, and epoxy mold compound wafers. Such wafers may be any suitable size. Preferred wafer diameters are 200 mm to 300 mm, although wafers having smaller and larger diameters may be suitably employed according to the present invention. As used herein, the term "semiconductive substrates" includes any substrate having one or more semiconductor layers or structures which include active or operable portions of semiconductor devices. The term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. A semiconductor device refers to a semiconductor substrate upon which at least one microelectronic device has been or is being fabricated.

The front (or device) side of a semiconductor wafer typically contains active devices. An "active" device is any type of circuit component with the ability to electrically control electron flow, such as, for example, transistors. Typically, the front side of a semiconductor wafer also includes various interconnect features, such as metal bond pads, solder bumps (or solder balls), metal pillars, and the like, as well as certain passivation layers such as metal oxides, metal nitrides, polymers such as polyimide, and the like. Metal bond pads typically comprise one or more metals chosen from copper, tin, gold, silver, aluminum, and alloys thereof, although other metals may be used. Exemplary solder bumps typically comprise one or more of tin, copper, silver, gold, lead, and bismuth, preferably tin, copper, silver, gold, and lead, and more preferably tin, copper, silver, gold, tin-lead, tin-silver, tin-zinc, tin-bismuth, and tin-silver-copper. Metal pillars typically comprise copper, often capped with one or more other metals, such as silver, tin-silver, or nickel. Preferably, the active surface of the semiconductor wafer is relatively hydrophilic as compared to the attachment surface of the carrier substrate. The hydrophilicity of the active surface may be increased by liquid or plasma treatment of the wafer surface to remove surface impurities such as adventitious carbon.

Any suitable carrier may be used as the carrier substrate. Exemplary carrier substrates include, without limitation, wafers, glass such as borosilicate, quartz, silica, and thermally stable polymers. Wafers used as carriers may be composed of silicon, silicon carbide, silicon germanium, silicon nitride, gallium arsenide, sapphire, and the like. Thermally stable polymers include, without limitation, any polymer stable to the temperatures used to cure the adhesive material, such as polyimide (for example, KAPTON™ polyimide, available from DuPont, Wilmington, Del.). Preferably, the attachment surface of the carrier substrate is relatively hydrophobic as compared to the active surface of the semiconductor wafer. If the attachment surface of the carrier substrate is insufficiently hydrophobic, the desired hydrophobicity may be imparted by any number of ways known in the art such as by contacting the attachment surface with a suitable adhesion promoter or by vapor treating the attachment surface. The attachment surface may be contacted with an adhesion promoter using any suitable method, such as spin-coating, dip coating, spray coating, curtain coating, roll coating, vapor deposition, and the like, and preferably by spin-coating. Various vapor treatments may be used to increase the hydrophobicity of the attachment surface, such as plasma treatments. Preferably, an adhesion promoter is used to treat the attachment surface to impart the desired hydrophobicity. Any suitable adhesion promoter may be used and the selection of such adhesion promoter is well within the ability of those skilled in the art. Preferred adhesion promoters are silane-containing materials, and more preferably trialkoxysilane-containing materials. Exemplary adhesion promoters include, but are not limited to: bis(trialkoxysilylalkyl)benzenes such as bis(t-rimethoxysilylethyl)benzene; aminoalkyl trialkoxy silanes such as aminopropyl trimethoxy silane, aminopropyl triethoxy silane, and phenyl aminopropyl triethoxy silane; and other silane coupling agents, as well as mixtures of the foregoing. Particularly suitable adhesion promoters include AP 3000, AP 8000, and AP 9000S, available from Dow Electronic Materials (Marlborough, Mass.).

The present temporary bonding compositions comprise a curable adhesive material, a release additive, a compatibilizer, and one or more optional components. Typically, the curable adhesive material has a modulus of >1 GPa when cured. Exemplary curable adhesive materials include, without limitation, polyarylene oligomers, cyclic-olefin oligomers, arylcyclobutene oligomers, vinyl aromatic oligomers, and mixtures thereof. The curable adhesive material may be substituted with any suitable moiety to provide additional hydrophobicity, such as fluorine-containing groups, as long as such moieties do not adversely impact the mechanical properties of the cured adhesive material. Preferably, the curable adhesive material is chosen from one or more arylcyclobutene oligomers, vinyl aromatic oligomers or mixtures thereof. When a mixture of different curable adhesive materials is used in the present invention, such materials are selected such that they cure with each other during the curing step. When a mixture of different curable materials are used, such curable materials are used in a weight ratio of 99:1 to 1:99, preferably from 95:5 to 5:95, more preferably from 90:10 to 10:90, and still more preferably from 75:25 to 25:75.

A wide variety of polyarylene oligomers may be used in the present invention. As used herein, the term "polyarylenes" includes polyarylene ethers. Suitable polyarylene oligomers may be synthesized from precursors such as ethynyl aromatic compounds of the formula:

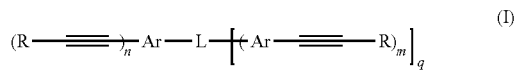

(I)

wherein each Ar is an aromatic group or inertly-substituted aromatic group: each R is independently hydrogen, an alkyl, aryl or inertly-substituted alkyl or aryl group; L is a covalent bond or a group which links one Ar to at least one other Ar; n and m are integers of at least 2; and q is an integer of at least 1. As such, the ethynyl aromatic compounds typically have four or more ethynyl groups (for example, tetraethynyl aromatic compounds).

Suitable polyarylene oligomers used in the temporary bonding compositions may comprise a polymer comprising as polymerized units:

(II)

wherein Ar' is the residual of the reaction of product of (C≡C)$_n$—Ar or Ar—(C≡C)$_m$ moieties and R, L, n and m are as defined above. Polyarylene copolymers useful in the invention include as polymerized units a monomer having the formula:

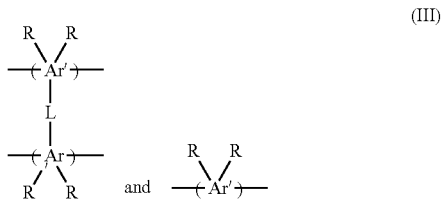

(III)

wherein Ar' and R are as defined above.

Exemplary polyarylenes include, but are not limited to, those wherein Ar-L-Ar is: biphenyl; 2,2-diphenyl propane; 9,9'-diphenyl fluorene; 2,2-diphenyl hexafluoro propane; diphenyl sulfide; oxydiphenylene; diphenyl ether; bis(phenylene)diphenylsilane; bis(phenylene)phosphine oxide; bis(phenylene)benzene; bis(phenylene)naphthalene; bis(phenylene)anthracene; thiodiphenylene; 1,1,1-triphenyleneethane; 1,3,5-triphenylenebenzene; 1,3,5-(2-phenylene-2-propyl)benzene; 1,1,1-triphenylenemethane; 1,1,2,2-tetraphenylene-1,2-diphenylethane; bis(1,1-diphenyleneethyl)benzene; 2,2'-diphenylene-1,1,1,3,3,3-hexafluoropropane; 1,1-diphenylene-1-phenylethane; naphthalene; anthracene; or bis(phenylene)napthacene; more preferably biphenylene; naphthylene; p,p'-(2,2-diphenylenepropane) (or —C$_6$H$_4$—C(CH$_3$)$_2$—C$_6$H$_4$—); p,p'-(2,2-diphenylene-1,1,1,3,3,3hexafluoropropene) and (—C$_6$H$_4$—C(CF$_3$)$_2$—C$_6$H$_4$—). Useful bis-phenyl derivatives include 2,2-diphenyl propane; 9,9'-diphenyl fluorene; 2,2-diphenyl hexafluoro propane; diphenyl sulfide; diphenyl ether; bis(phenylene)diphenylsilane; bis(phenylene)phosphine oxide; bis(phenylene)benzene; bis(phenylene)naphthalene; bis(phenylene)anthracene; or bis(phenylene)napthacene. Particularly suitable polyarylenes for use in the present invention include those sold as SiLK™ Semiconductor Dielectric (available from Dow Electronic Materials, Marlborough, Mass.).

The polyarylene precursor monomers may be prepared by a variety of methods known in the art, such as described in Int. Pat. App. No. WO 97/10193 (Babb). The ethynyl aromatic monomers of Formula (I) are useful to prepare polymers of either Formula (II) or (III). Polymerization of the ethynyl aromatic monomers is well within the ability of one skilled in the art. While the specific conditions of polymerization are dependent on a variety of factors including the specific ethynyl aromatic monomer(s) being polymerized and the desired properties of the resulting polymer, the general conditions of polymerization are detailed in Int. Pat. App. No. WO 97/10193 (Babb).

Suitable cyclic-olefin materials are poly(cyclic-olefins), which may be thermoplastic, and preferably have a weight average molecular weight ($M_w$) of from 2000 to 200,000, more preferably from 5000 to 100,000, and even more preferably from 2000 to 50,000. Preferred poly(cyclic-olefins) have a softening temperature (melt viscosity at 3,000 PaS) of at least 100° C., and more preferably at least 140° C. Suitable poly(cyclic-olefins) also preferably have a glass transition temperature ($T_g$) of at least 60° C., more preferably from 60 to 200° C., and most preferably from 75 to 160° C.

Preferred poly(cyclic-olefins) are comprised of recurring monomers of cyclic-olefins and acyclic olefins, or ring-opening polymers based on cyclic-olefins. Suitable cyclic olefins for use in the present invention are chosen from norbornene-based olefins, tetracyclododecene-based olefins, dicyclopentadiene-based olefins, and derivatives thereof. Derivatives include alkyl (preferably $C_1$-$C_{20}$ alkyls, more preferably $C_1$-$C_{10}$ alkyls), alkylidene (preferably $C_1$-$C_{20}$ alkylidenes, more preferably $C_1$-$C_{10}$ alkylidenes), aralkyl (preferably $C_6$-$C_{30}$ aralkyls, more preferably $C_6$-$C_{18}$ aralkyls), cycloalkyl (preferably $C_3$-$C_{30}$ cycloalkyls, more preferably $C_3$-$C_{18}$ cycloalkyls), ether, acetyl, aromatic, ester, hydroxy, alkoxy, cyano, amide, imide, and silyl-substituted derivatives. Particularly preferred cyclic-olefins for use in the present invention include those chosen from

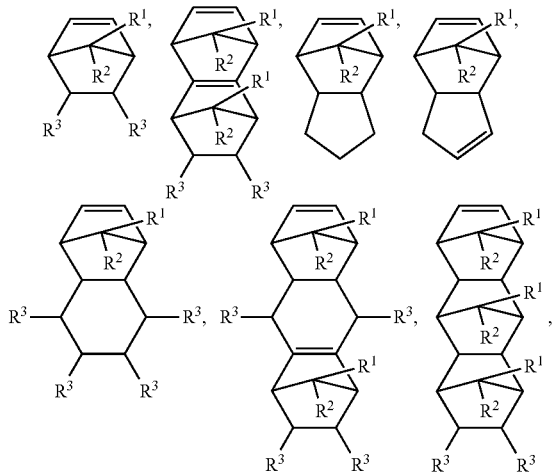

and combinations of the foregoing, where each $R^1$ and $R^2$ is independently chosen from H, and alkyl groups (preferably $C_1$-$C_{20}$ alkyls, more preferably $C_1$-$C_{10}$ alkyls), and each $R^3$ is independently chosen from H, substituted and unsubstituted aryl groups (preferably $C_6$-$C_{18}$ aryls), alkyl groups (preferably $C_1$-$C_{20}$ alkyls, more preferably $C_1$-$C_{10}$ alkyls), cycloalkyl groups (preferably $C_3$-$C_{30}$ cycloalkyl groups, more preferably $C_3$-$C_{18}$ cycloalkyl groups), aralkyl groups (preferably $C_6$-$C_{30}$ aralkyls, more preferably $C_6$-$C_{18}$ aralkyl groups such as benzyl, phenethyl, phenylpropyl, and the like), ester groups, ether groups, acetyl groups, alcohols (preferably $C_1$-$C_{10}$ alcohols), aldehyde groups, ketones, nitriles, and combinations thereof.

Preferred acyclic olefins are chosen from branched and unbranched $C_2$-$C_{20}$ alkenes (preferably $C_2$-$C_{10}$ alkenes). More preferably, the acyclic olefins have the structure $(R^4)_2C=C(R^4)_2$, where each $R^4$ is independently chosen from H and alkyl groups (preferably $C_1$-$C_{20}$ alkyls, more preferably $C_1$-$C_{10}$ alkyls). Particularly preferred acyclic olefins for use in the present invention include those chosen from ethene, propene, and butene.

Cyclic-olefin copolymers are well-known in the art. For example, cyclic-olefin copolymers can be produced by chain polymerization of a cyclic monomer with an acyclic monomer, such as disclosed in U.S. Pat. No. 6,008,298. Cyclic-olefin copolymers can also be produced by ring-opening metathesis polymerization of various cyclic monomers followed by hydrogenation, such as disclosed in U.S. Pat. No. 5,191,026. Suitable cyclic-olefin copolymers include those available under the TOPAS™ (produced by Topas Advanced Polymers), APEL™ (produced by Mitsui Chemicals), ZEONOR™ (from Zeon Chemicals) and ARTON™ (from JSR Corporation) brands.

Arylcyclobutene oligomers useful as the present curable adhesive materials are well-known in the art. Suitable arylcyclobutene oligomers include, but are not limited to, those having the formula:

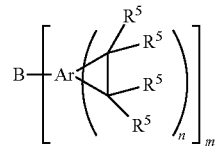

wherein B is an n-valent linking group; Ar is a polyvalent aryl group and the carbon atoms of the cyclobutene ring are bonded to adjacent carbon atoms on the same aromatic ring of Ar; m is an integer of 1 or more; n is an integer of 1 or more; and $R^5$ is a monovalent group. Preferably, the polyvalent aryl group, Ar, may be composed of 1-3 aromatic carbocyclic or heteroaromatic rings. It is preferred that the aryl group comprise a single aromatic ring, and more preferably a phenyl ring. The aryl group is optionally substituted with 1 to 3 groups chosen from ($C_1$-$C_6$)alkyl, tri($C_1$-$C_6$)alkylsilyl, ($C_1$-$C_6$)alkoxy, and halo, preferably with one or more of ($C_1$-$C_6$)alkyl, tri($C_1$-$C_3$)alkylsilyl, ($C_1$-$C_3$)alkoxy, and chloro, and more preferably with one or more of ($C_1$-$C_3$)alkyl, tri($C_1$-$C_3$)alkylsilyl, and ($C_1$-$C_3$)alkoxy. It is preferred that the aryl group is unsubstituted. It is preferred that n=1 or 2, and more preferably n=1. It is preferred that m=1-4, more preferably m=2-4, and yet more preferably m=2. Preferably, $R^5$ is chosen from H and ($C_1$-$C_6$)alkyl, and more preferably from H and ($C_1$-$C_3$)alkyl. Preferably, B comprises one or more carbon-carbon double bonds (ethylenic unsaturation). Suitable single valent B groups preferably have the formula $-[C(R^{10})=CR^{11}]_xZ$, wherein $R^{10}$ and $R^{11}$ are independently chosen from hydrogen, ($C_1$-$C_6$)alkyl, and aryl; Z is chosen from hydrogen, ($C_1$-$C_6$)alkyl, aryl, siloxanyl, $-CO_2R^{12}$; each $R^{12}$ is independently chosen from H, ($C_1$-$C_6$)alkyl, aryl, aralkyl, and alkaryl; and x=1 or 2. Preferably, $R^{10}$ and $R^{11}$ are independently chosen from H, ($C_1$-$C_3$)alkyl, and aryl, and more preferably H and ($C_1$-$C_3$)alkyl. It is preferred that $R^{12}$ is ($C_1$-$C_3$)alkyl, aryl, and aralkyl. Z is preferably siloxyl.

Preferred siloxyl groups have the formula —[Si(R$^{13}$)$_2$—O]$_p$-Si(R$^{13}$)$_2$—, wherein each R$^{13}$ is independently chosen from H, (C$_1$-C$_6$)alkyl, aryl, aralkyl, and alkaryl; and p is an integer from 1 or more. It is preferred that R$^{13}$ is chosen from (C$_1$-C$_3$)alkyl, aryl, and aralkyl. Suitable aralkyl groups include benzyl, phenethyl and phenylpropyl.

Preferably, the arylcyclobutene oligomers comprise one or more oligomers of the formula:

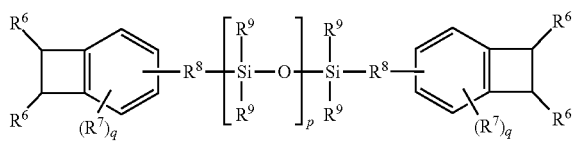

wherein each R$^6$ is independently chosen from H and (C$_1$-C$_6$)alkyl, and preferably from H and (C$_1$-C$_3$)alkyl; each R$^7$ is independently chosen from (C$_1$-C$_6$)alkyl, tri(C$_1$-C$_6$)alkylsilyl, (C$_1$-C$_6$)alkoxy, and halo; each R$^8$ is independently a divalent, ethylenically unsaturated organic group; each R$^9$ is independently chosen from H, (C$_1$-C$_6$)alkyl, aralkyl and phenyl; p is an integer from 1 or more; and q is an integer from 0-3. Each R$^6$ is preferably independently chosen from H and (C$_1$-C$_3$)alkyl, and more preferably each R$^6$ is H. It is preferred that each R$^7$ is independently chosen from (C$_1$-C$_6$)alkyl, tri(C$_1$-C$_3$)alkylsilyl, (C$_1$-C$_3$)alkoxy, and chloro, and more preferably from (C$_1$-C$_3$)alkyl, tri(C$_1$-C$_3$)alkylsilyl, and (C$_1$-C$_3$)alkoxy. Preferably, each R$^8$ is independently chosen from a (C$_2$-C$_6$)alkenyl, and more preferably each R$^8$ is —CH=CH—. Each R$^9$ is preferably chosen from (C$_1$-C$_3$)alkyl, and more preferably each R$^9$ is methyl. Preferably, p=1-5, more preferably p=1-3, and yet more preferably p=1. It is preferred that q=0. A particularly preferred arylcyclobutene oligomer, 1,3-bis(2-bicyclo[4.2.0]octa-1,3,5-trien-3-yl ethenyl)-1,1,3,3 tetramethyldisiloxane ("DVS-bisBCB"), has the formula

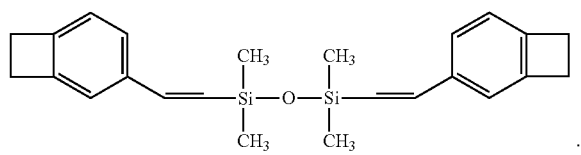

Arylcyclobutene oligomers may be prepared by any suitable means, such as those described in U.S. Pat. Nos. 4,812,588; 5,136,069; 5,138,081; and Int. Pat. App. No. WO 94/25903. Suitable arylcyclobutene oligomers are also commercially available under the CYCLOTENE™ brand, available from Dow Electronic Materials.

Any vinyl aromatic oligomers capable of being cured may be used as the curable adhesive materials in the present. Such vinyl aromatic oligomers are typically oligomers of a vinyl aromatic monomer with one or more reactive ethylenically unsaturated co-monomers. Preferably, the vinyl aromatic monomers contain one vinyl group. Suitable vinyl aromatic monomers are unsubstituted vinyl aromatic monomers and substituted vinyl aromatic monomers where one or more hydrogens are replaced with a substituent group selected from the group of (C$_1$-C$_6$)alkyl, (C$_1$-C$_6$)alkoxy, halo, and amino. Exemplary vinyl aromatic monomers include, without limitation, styrene, vinyltoluene, vinylxylene, vinylanisole, vinyl dimethoxybenzene, vinylaniline, halostyrene such as fluorostyrene, α-methylstyrene, β-methoxystyrene, ethylvinylbenzene, vinylpyridines, vinylimidazoles, vinylpyrroles, and mixtures thereof. Preferred vinyl aromatic monomers are styrene, vinyltoluene, vinylxylene, vinylanisole, ethylvinylbenzene, and mixtures thereof. Preferred reactive co-monomers are those comprising a reactive moiety, that is, a moiety capable of further polymerization (or crosslinking) following formation of the vinyl aromatic oligomer, such as an allyl moiety or a vinyl group, in addition to an olefinic (or ethylenically unsaturated) moiety used to form the vinyl aromatic oligomer. More preferably, the reactive co-monomers comprise an allyl moiety in addition to the ethylenic unsaturation used to form the vinyl aromatic oligomer, and even more preferably comprise an allyl ester moiety in addition to the ethylenic unsaturation. Exemplary reactive co-monomers useful in forming the vinyl aromatic oligomers include, but are not limited to, diallyl maleate, allyl acrylate, allyl methacrylate, allyl cinnamate, diallyl fumarate, allyl tiglate, divinylbenzene, and mixtures thereof. Preferred reactive co-monomers are diallyl maleate, allyl acrylate, allyl methacrylate and mixtures thereof, and more preferably diallyl maleate, allyl methacrylate and mixtures thereof. It will be appreciated by those skilled in the art that one or more secondary co-monomers may also be used to form the vinyl aromatic oligomers. Such secondary co-monomers are ethylenically unsaturated, but do not contain a reactive moiety. Exemplary secondary co-monomers include, but are not limited to, (meth)acrylic acid, (meth)acrylamides, (C$_1$-C$_{10}$)alkyl(meth)acrylates, aromatic (meth)acrylates, substituted ethylene monomers, and poly(alkylene oxide)monomers.

The molar ratio of vinyl aromatic monomers to co-monomers in such vinyl aromatic oligomers is preferably from 99:1 to 1:99, more preferably from 95:5 to 5:95, and still more preferably from 90:10 to 10:90. Such vinyl aromatic oligomers may be prepared by any suitable method, such as any of those known in the art. Typically, vinyl aromatic oligomers are prepared by free-radical polymerization of a vinyl aromatic monomer and a co-monomer. Preferred vinyl aromatic oligomers comprise unreacted allyl moieties that allow such oligomers to further cure.

A wide variety of materials may be used as the release additives in the temporary bonding compositions provided that such materials do not react with the adhesive material under conditions of storage and use, and are non-curable under the conditions used to cure the adhesive material. In addition, the release additives should be compatible with the temporary bonding composition, that is, the release additives must be dispersible, miscible or otherwise substantially compatible with the adhesive material, and any other components, such as organic solvents, used in the temporary bonding composition. The present release additives are sufficiently non-volatile such that they do not substantially evaporate under the conditions of use, that is, they substantially do not evaporate during any deposition step, such as spin-coating, or any subsequent heating step used to remove any organic solvent or to cure the adhesive material. When a film or layer of the temporary bonding composition is cast, such as by spin-coating, much (or all) of the solvent evaporates. It is preferred that the release additive is soluble in any organic solvent used, but is not completely soluble in the curable adhesive material. The release additives are preferentially more hydrophilic than the cured adhesive material. Not being bound by theory, it is believed that upon curing of the adhesive material, the release additive phase separates and migrates preferentially toward the active surface of the wafer (the more hydrophilic surface as compared to the carrier surface). The use of appropriate hydrophilic moieties in the release additives allow for complete dispersion, or preferably dissolution, of the release additive in the temporary bonding composition, and phase separation of the release additive during curing of the adhesive material with migration of the release additive toward the more hydrophilic surface. Any material which does not phase separate from the adhesive material during curing will not function as a release additive according to the present invention.

In general, the release additives will contain one or more relatively hydrophilic moieties, such as moieties containing one or more of oxygen, nitrogen, phosphorus, and sulfur. Suitable release additives include, without limitation: ethers, esters, carboxylates, alcohols, thioethers, thiols, amines, imines, amides, and mixtures thereof. Preferably, the release additives contain one or more polar end groups, which contain one or more of oxygen, nitrogen and sulfur, and preferably oxygen. Exemplary polar end groups include: alkoxy, aryloxy, hydroxy, carboxylate, alkoxycarbonyl, mercapto, alkylthio, primary amine, secondary amine, and tertiary amine; preferably the end groups are chosen from $(C_1-C_6)$alkoxy, $(C_6-C_{10})$aryloxy, hydroxy, carboxylate, $(C_1-C_6)$alkoxycarbonyl, mercapto, $(C_1-C_6)$alkylthio, amino, $(C_1-C_6)$alkylamino, and di$(C_1-C_6)$alkylamino; more preferably from $(C_1-C_6)$alkoxy, $(C_6-C_{10})$aryloxy, hydroxy, carboxylate, and $(C_1-C_6)$alkoxycarbonyl; and even more preferably from $(C_1-C_6)$alkoxy, hydroxy, carboxylate, and $(C_1-C_6)$alkoxycarbonyl. Particularly preferred polar end groups are chosen from hydroxy, methoxy, ethoxy, propoxy, butoxy, carboxyl, and acetoxy. Preferably, the release additives are free of silicon.

Suitable release additives have a number average molecular weight ($M_n$) of $\leq 10,000$, preferably $\leq 7500$, and more preferably $\leq 7000$. The release additives have a minimum molecular weight ($M_n$) sufficient to render the release additives substantially non-volatile during conditions of use, that is, <5%, preferably <3%, and more preferably $\leq 1\%$ of the release additive is volatilized during use. Preferably, the release additives have a $M_n$ of $\geq 500$. A preferred range of $M_n$ is from 500 to 10,000, more preferably from 500 to 7500, and yet more preferably from 500 to 7000 Da. While the release additives may be linear polymers; branched polymers such as dendritic polymers, star polymers, and the like; polymer particles; and the like, it is preferred that the release additives are linear polymers or polymer particles, and more preferably linear polymers. While not being bound by theory, it is believed that linear polymers are better able to migrate through the curing adhesive material phase toward the hydrophilic wafer surface as compared to branched polymers.

Polyethers are the preferred release additives. Polyether compounds include alkyleneoxide homopolymers and alkyleneoxide copolymers, which copolymers may be random or block. Polyalkylene oxide release additives may have a variety of polar end groups, preferably such polar end groups are hydroxy, $(C_1-C_6)$alkoxy, $(C_1-C_6)$alkoxycarbonyl, and amino, and more preferably hydroxy, $(C_1-C_3)$alkoxy, and acetoxy. Preferred polyether compounds are polyglycols (or polyalkylene oxides), such as poly$(C_1-C_4)$alkylene oxide compounds, which may comprise a single alkylene oxide repeating unit, or two or more different alkylene oxide repeating units. Preferred polyether compounds include polyethylene glycol, polypropylene glycol, poly(1,3-propanediol), poly(tetrahydrofuran), ethylene oxide (EO)-propylene oxide (PO) copolymers, ethylene oxide-butylene oxide copolymers, and mixtures thereof. Other suitable release additives include polyalkylene oxide functionalized polyamines, such as EO/PO tetrafunctionalized ethylenediamine. Preferably, when the release additive comprises butylene oxide as a repeating unit, it is a copolymer with one or more different alkylene oxide repeating units. It will be appreciated by those skilled in the art that mixtures of release additives may be used in the present temporary bonding compositions. Suitable release additives include polyethers sold under the PLURONIC, TETRONIC and POLYTHF product names (available from BASF, Ludwigshafen, Germany), the FORTEGRA product name (available from The Dow Chemical Company, Midland Mich.), and the TERATHANE product name (available from Invista, Wichita, Kans.), all of which may be used without further purification.

As used throughout this specification, the term "compatibilizer" refers to any material which is miscible in (dissolves) or disperses in the adhesive material, provided that such compatibilizer does not react with the adhesive material under conditions of storage and use, does not cure under the conditions employed to cure the adhesive material, and increases the amount of the release additive that can be dissolved or dispersed in the adhesive material as compared to when no compatibilizer is used. The present compatibilizers are sufficiently non-volatile such that they do not substantially evaporate under the conditions of use, that is, they do not substantially evaporate during any deposition step, such as spin-coating, or any subsequent heating step used to remove any organic solvent or to cure the adhesive material. That is, $\leq 10\%$, preferably $\leq 5\%$, and more preferably $\leq 2\%$ of the compatibilizer evaporates under the conditions of use. It is preferred that the compatibilizer is soluble in any organic solvent used in the present compositions and is miscible in the adhesive material, and remains dissolved or dispersed in the adhesive material following removal of any solvent. While not wishing to be bound by theory, it is believed that under the conditions of use the compatibilizer does not act as a release additive in that it does not form a separate phase from the adhesive material during curing of the adhesive material. Preferably, the compatibilizer is selected such that it remains dissolved or dispersed in the cured adhesive material and functions to lower the elastic modulus of the cured adhesive material, as compared to when no compatibilizer is used. Such reduction in elastic modulus aids in release of the cured adhesive material from the active side of a semiconductor wafer, particularly when the wafer has relatively tall (e.g., $\geq 20$ µm) interconnect features, and/or a pitch density of 2:1 or greater.

Preferred compatibilizers are polyethers comprising butyleneoxide units, and more preferably are polybutyleneoxide homopolymers or poly(butyleneoxide-propyleneoxide) copolymers. The compatibilizers may optionally be end-capped, preferably the compatibilizers contain 1 end cap, and more preferably 2 end caps. Particularly preferred compatibilizers are polybutyleneoxides of the formula $R^{14}$—O—$(C_4H_8O)_z$—$(C_3H_6O)_y$—$R^{15}$; wherein each of $R^{14}$ and $R^{15}$ is independently chosen from H, $(C_1-C_{20})$alkyl, H—$(R^{16}O)_w$—$R^{17}$, or $(C_6-C_{20})$aryl; each $R^{16}$ and $R^{17}$ are independently $(C_1-C_6)$alkylidene; w is an integer from 1 to 5; z is an integer from 5 to 250, and y is an integer from 0 to 200. Each of $R^{14}$ and $R^{15}$ are preferably independently chosen from H, H—$(R^{16}O)_w$—$R^{17}$, or $(C_6-C_{20})$aryl, and more preferably from $(C_2-C_{10})$alkyl, H—$(R^{16}O)_w$—$R^{17}$, or $(C_6-C_{20})$aryl. Preferably, $R^{14}$ is not H, and more preferably both $R^{14}$ and $R^{15}$ are not H. It is preferred that $R^{16}$ and $R^{17}$ are independently $(C_2-C_6)$alkylidene, and more preferably $(C_2-C_4)$alkylidene. As used herein, $(C_6-C_{20})$aryl refers to any moiety having an aryl moiety and a total of 6 to 20 carbons, and includes phenyl-substituted $(C_1-C_{14})$alkyl moieties and $(C_1-C_{14})$alkyl substituted phenyl moieties. Exemplary $(C_6-C_{20})$aryl moieties include, without limitation: phenyl; benzyl; phenethyl; tolyl; xylyl; octylphenyl; dodecylphenyl; and the like. It is preferred that w is 1 to 3, and more preferably 1 to 2. Preferably, z is an integer from 5 to 200, and more preferably from 10 to 150. It is preferred that y is an integer from 0 to 150, more preferably from 0 to 100, and yet more preferably 0 to 50. When y>0, the resulting poly(butyleneoxide-propyleneoxide) copolymer may be random, block or alternating. Increasing the butyleneoxide:propyleneoxide ratio and/or the hydrophobicity of the end caps in such copolymers provides compounds having a higher level of compatibility with both the adhesive material and the release additive used. It is further preferred that the compatibilizers have a number average molecular weight of from 300 to 7500, more preferably from 500 to 6000, and yet more preferably from 500 to 5000 Da. As the molecular weight of the compatibilizers increases much above 7500, the ability of the compatibilizers to increase the amount of release additive dissolved or dispersed in the temporary bonding composition decreases.

It is preferred that one or more organic solvents be used in the temporary bonding composition. Any solvent or mixture of solvents that dissolves or disperses, and preferably dissolves, the curable adhesive material, the release additive, and the compatibilizer may suitably be used in the temporary bonding compositions. Exemplary organic solvents include, without limitation: aromatic hydrocarbons such as toluene, xylene, and mesitylene; alcohols such as 2-methyl-1-butanol, 4-methyl-2-pentanol, and methyl isobutyl carbinol; esters such as ethyl lactate, propylene glycol methyl ether acetate, and methyl 2-hydroxyisobutyrate; lactones such as gamma-butyrolactone; lactams such as N-methylpyrrolidinone; ethers such as propylene glycol methyl ether and dipropylene glycol dimethyl ether isomers (commercially available from The Dow Chemical Company as PROGLYDE™ DMM); ketones such as cyclohexanone and methylcyclohexanone; and mixtures thereof.

The present temporary bonding compositions may optionally include one or more additional components, such as curing agents, antioxidants, thickening agents, and the like. Suitable curing agents may aid in the curing of the adhesive material, and may be activated by heat or light. Exemplary curing agents include, but are not limited to, thermally generated initiators, photoinitiators, azides, nitrenes, and crosslinking agents such as polyamines and polythiols. Thickening agents include any materials that increase the viscosity of the temporary bonding composition, such as to reduce bleed out of the composition from between the carrier and active device before the adhesive material has fully cured. Thickening agents also include low molecular weight materials that may be quickly advanced (polymerized) in order to increase the viscosity of the temporary bonding composition in use. The selection of such additional components is well within the ability of those skilled in the art.

The temporary bonding composition comprises one or more curable adhesive materials in an amount of 50 to 99 wt %, one or more release additives in an amount of 1 to 50 wt %, one or more compatibilizers in an amount of 1 to 40 wt %, optionally organic solvent, and optionally one or more additional components. The curable adhesive material is preferably present in an amount of 50 to 95 wt %. It is preferred that the release additive is present in an amount of 2 to 50, more preferably from 5 to 45, and even more preferably from 5 to 40 wt %. Preferably, the compatibilizer is present in an amount of 1 to 35 wt %, and more preferably from 5 to 30 wt %. If the combined amount of compatibilizer and the release additive in the present composition is too large, that is much above 40 wt %, the compatibilizer may disrupt the integrity (cohesiveness) of the bulk cured adhesive material. The amount of the compatibilizer is typically selected such that the temporary bonding composition is a transparent solution by visual inspection at room temperature. Typically, the weight ratio of release additive to the compatibilizer is from 5:1 to 1:5, and preferably from 3:1 to 1:3.5. When present, the amount of organic solvent is preferably sufficient to dissolve or disperse, and preferably dissolve, the curable adhesive material, the release additive and the compatibilizer. The amount of organic solvent is typically from 0 to 50 wt %. Preferably, an organic solvent is used. The present temporary bonding compositions may be prepared by combining the curable adhesive material, the release additive, the compatibilizer, and any optional components in any order. Typically, the weight ratio of release additive to the compatibilizer is from 5:1 to 1:5, and preferably from 3:1 to 1:3.5.

In use, the present temporary bonding compositions may be disposed by any suitable method on the attachment surface of the carrier substrate, the front side of the semiconductor wafer, or on both surfaces. Suitable methods for disposing the temporary bonding composition include, but are not limited to, spin-coating, curtain coating, spray coating, roller coating, dip coating, vapor deposition, and lamination such as vacuum lamination, among other methods. In the semiconductor manufacturing industry, spin-coating is a preferred method to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the temporary bonding composition dispensed on the wafer or substrate depends on the total solids content in the composition, the desired thickness of the resulting temporary bonding layer, and other factors well-known to those skilled in the art. When a film or layer of the temporary bonding composition is cast, such as by spin-coating, much (or all) of the solvent evaporates during deposition of the film. Preferably, after being disposed on a surface, the temporary bonding composition is heated (baked) to remove any remaining solvent. Typical baking temperatures are from 90 to 160° C., although other temperatures may be suitably used. Such baking to remove residual solvent is typically done for approximately 2 minutes, although longer or shorter times may suitably be used.

In an alternate preferred method, the temporary bonding composition is formed as a dry film and is disposed on the attachment surface of the carrier substrate, the front side of the semiconductor wafer, or on both surfaces by lamination. A variety of suitable lamination techniques, including vacuum lamination techniques, may be used and are well known to those skilled in the art. In forming a dry film, the temporary bonding composition is first disposed onto a front surface of a suitable film support sheet such as a polyester sheet, preferably polyethyleneterephthalate (PET) sheet, or a polyimide sheet such as KAPTON™ polyimide, using slot-die coating, gravure printing, or another appropriate method. The composition is then soft baked at a suitable temperature, such as from 90 to 140° C., for an appropriate time, such as from 1 to 30 minutes, to remove any solvent. A polymer film cover sheet such as polyethylene is then roll-laminated at room temperature onto the dried temporary bonding composition to protect the composition during storage and handling. To dispose the dried temporary bonding composition onto the carrier and/or the semiconductor wafer, the cover sheet is first removed. Then, the dried temporary bonding composition on the support sheet is laminated onto the appropriate surface using roll-lamination or vacuum lamination. The lamination temperature can range from 20 to 120° C. The support sheet is then removed (peeled), leaving the dried temporary bonding composition on that surface. Using this method, the structures illustrated in FIGS. 1A, 1B, and 1C can all be realized.

Figure 1B:
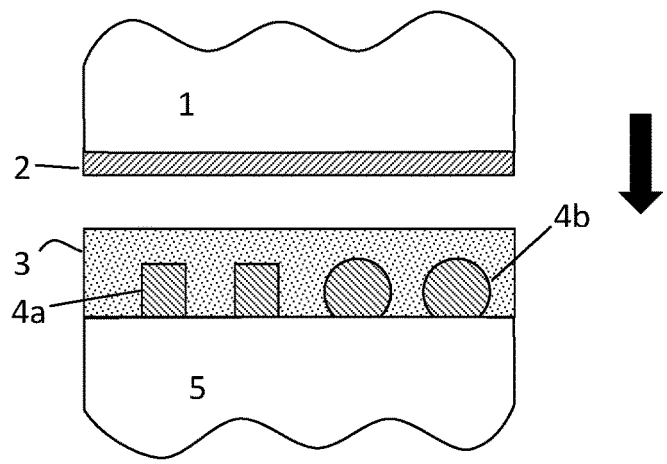
Figure 1C:
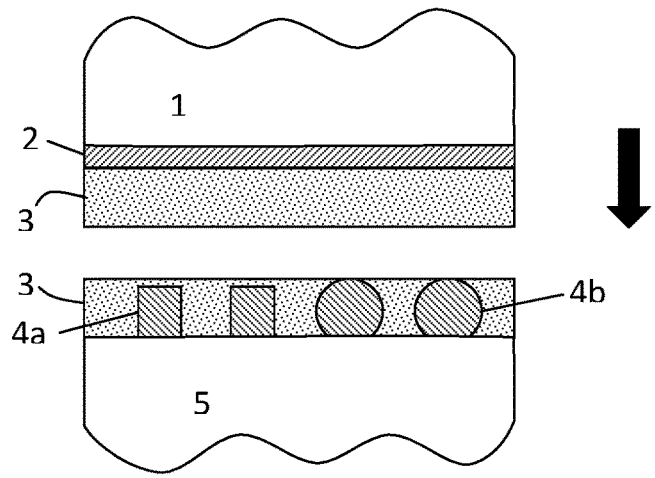

FIG. 1A illustrates a first embodiment of the invention where temporary bonding composition 3 is disposed, such as by spin-coating, on optional adhesion promoter layer 2 on the attachment surface of carrier substrate 1. FIG. 1B illustrates an alternate embodiment of the invention where temporary bonding composition 3 is disposed on the front surface of semiconductor wafer 5 having interconnect features such as metal pillars 4a and/or solder bumps 4b. It will be appreciated by those skilled in the art that a semiconductor wafer may have only metal pillars, or solder bumps, or a combination of metal pillars and solder bumps, or neither metal pillars nor solder bumps. Temporary bonding composition 3 in FIG. 1B is sufficiently flowable to fill-in around features 4a and 4b. In FIG. 1B, the attachment surface of carrier substrate 1 has optional adhesion promoter layer 2. FIG. 1C illustrates a third embodiment of the invention where temporary bonding composition 3 is disposed both on the front side of semiconductor wafer 5 and on the attachment surface of carrier substrate 1 having adhesion promoter layer 2. Temporary bonding composition 3 in FIG. 1C is sufficiently flowable to fill-in around features 4a and 4b. In FIG. 1C, the temporary bonding composition disposed on the semiconductor wafer may be the same as, or different from, the temporary bonding disposed on the attachment surface of the carrier substrate. It will be appreciated by those skilled in the art that multiple layers of the temporary bonding composition may be applied in order to achieve the desired thickness.

After the temporary bonding composition is disposed on the front side of the semiconductor wafer or the attachment surface of the carrier substrate, a structure is formed by bringing the attachment surface of the carrier wafer or the front surface of the semiconductor wafer, respectively, into contact with the temporary bonding composition, as illustrated by the arrows in FIGS. 1A and 1B. After the temporary bonding composition is disposed on both the front side of the semiconductor wafer and the attachment surface of the carrier substrate, a structure is formed by bringing the two temporary bonding composition layers into contact, as illustrated by the arrow in FIG. 1C. Any suitable method may be used to bring into contact the carrier substrate, semiconductor wafer and temporary bonding composition, such as by thermocompression bonding, where pressure and heat are applied. Exemplary methods are described in U.S. Pat. No. 7,713,835 and in U.S. Pat. App. Pub. Nos. 2010/0263794 and 2011/0272092. Typically, thermocompression bonding is carried out under vacuum in order to reduce voiding. It is preferred that both the carrier substrate and the semiconductor wafer are placed in a vacuum chamber, the temporary bonding composition disposed on at least one of the carrier substrate and the wafer is then heated to a desired temperature, such as 50 to 200° C. for 1 to 10 minutes in the case of an arylcyclobutene adhesive material, next the chamber is evacuated and the carrier substrate and the semiconductor wafer are contacted to the temporary bonding composition, and the chamber is then optionally pressurized, such as to 1 to 100 kPa. Next, the bonded pair may be removed from the chamber and cured, or optionally cured within the chamber. Curing of the temporary bonding composition is typically achieved by heating the composition to a temperature of 180 to 250° C. for 1 to 600 minutes in the case of an arylcyclobutene adhesive material.

Figure 2A:
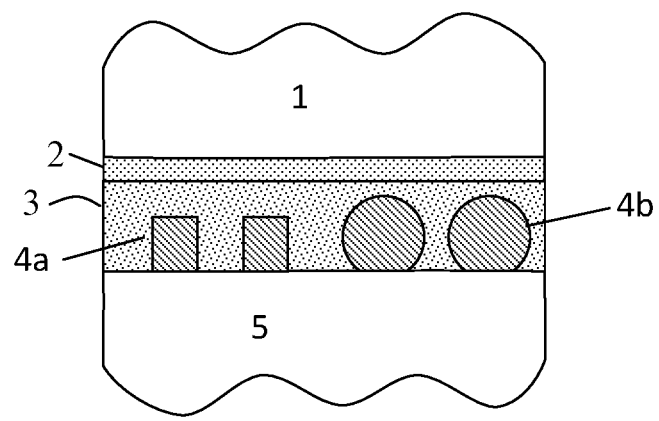
FIGS. 2A-2F are schematic diagrams illustrating the process of the invention.

FIG. 2A illustrates a structure formed after the components illustrated in each of FIGS. 1A-1C are brought into contact. In FIG. 2A, semiconductor wafer 5 has interconnect features shown as metal pillars 4a and solder bumps 4b, temporary bonding composition 3 is directly adjacent semiconductor wafer 5 and is disposed around features 4a and 4b, the temporary bonding composition is also directly adjacent to optional adhesion promoter layer 2 which is directly adjacent carrier substrate 1. Once the structure in FIG. 2A is formed, the temporary bonding composition is then subjected to conditions sufficient to cure the adhesive material. Such conditions include heating, exposure to actinic radiation (light) or a combination thereof. Preferably, heating is used, either alone or in combination with exposure to light, and more preferably the adhesive material is cured by heating. The rate of heating is chosen such that the adhesive material does not cure instantaneously, but cures in a more controlled manner. That is, the rate of polymerization must be less than the rate of phase separation of the release additive.

Figure 2B:
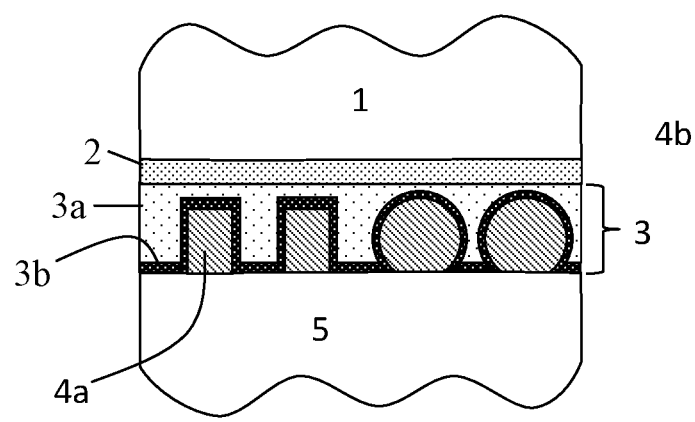

During curing, without being bound by theory, it is believed that the release additive phase separates from the curing adhesive material (that is, polymerization induced phase separation occurs) and generally migrates toward the relatively more hydrophilic surface (front side) of the semiconductor wafer. It is also believed that the compatibilizer does not form a separate phase from the curing adhesive material and substantially remains in the cured adhesive material. Following curing, a temporary bonding layer is formed between the semiconductor wafer and the attachment surface of the carrier substrate as illustrated in FIG. 2B, where the cured temporary bonding composition (now the temporary bonding layer) 3 is composed of a first region 3a adjacent to the carrier wafer comprising a relatively lower amount of release additive and a second region 3b adjacent to the semiconductor wafer and comprising a relatively higher (greater) amount of release additive. Region 3b is relatively smaller as compared to region 3a. FIG. 2B shows defined regions 3a and 3b only for purposes of illustration. It is believed, without being bound by theory, that regions 3a and 3b may represent a continuum of concentrations (from lower at 3a to higher at 3b) of the release additive in the temporary bonding layer or they may represent distinct regions comprising different concentrations of the release additive, where region 3b may comprise a predominant amount of release additive. Whether regions 3a and 3b represent distinct regions or a continuum, region 3b predominantly comprises the release additive. While not wishing to be bound by theory, it is believed that the compatibilizer remains substantially distributed within the cured adhesive material. When the cured adhesive material (temporary bonding layer) is composed of an arylcyclobutene adhesive material, such cured material typically has a modulus of >1 GPa, and an elongation of <20% at the breaking point.

Figure 2C:
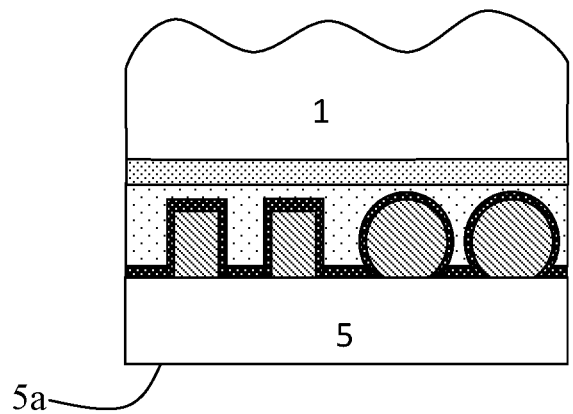
Figure 2D:
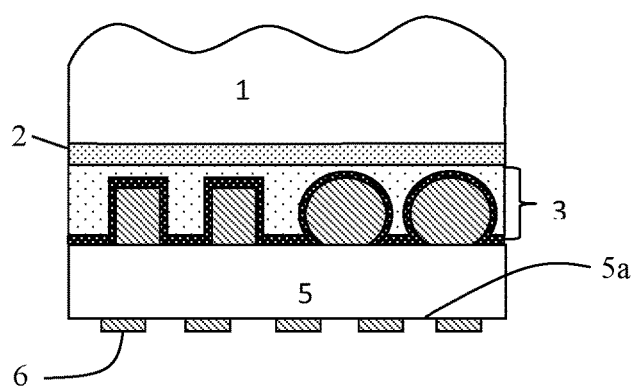

Once the temporary bonding layer is formed, one or more suitable operations may be performed on the semiconductor wafer, such as grinding (thinning) the backside of the wafer, as illustrated in FIG. 2C where the backside of semiconductor wafer 5 has been ground (thinned) and a flat surface 5a formed. Further operations may be performed, such as patterning, the formation of via holes, and the formation of conductive contacts on the backside of the semiconductor wafer. FIG. 2D illustrates a structure having carrier substrate 1 having an optional adhesion promoter layer 2, temporary bonding layer 3 joining semiconductor wafer 5 to carrier substrate 1, where the temporary bonding layer surrounds interconnect features, such as metal pillars and/or solder bumps on the front side of the semiconductor wafer, where the backside of wafer 5 has been ground and metal contacts 6 formed thereon.

The greater concentration of release additive adjacent, and preferably directly adjacent, to the front side of the semiconductor wafer relative to the concentration of the release additive in the temporary bonding layer adjacent to the carrier substrate provides a structure having a lower adhesion energy between the semiconductor wafer and the temporary bonding layer as compared to the adhesion energy between the carrier substrate and the temporary bonding layer. Preferably, the difference in adhesion energy between the semiconductor wafer-temporary bonding layer interface and the carrier substrate-temporary bonding layer interface is >20 $J/m^2$, and more preferably >25 $J/m^2$. The adhesion energy between the temporary bonding layer and the front side of a semiconductor wafer that does not have interconnect structures is ≤5 $J/m^2$, preferably <5 $J/m^2$, more preferably <3 $J/m^2$, and most preferably ≤2 $J/m^2$. The adhesion energy between the temporary bonding layer and the attachment surface of the carrier substrate is preferably >30 $J/m^2$, more preferably >35 $J/m^2$, and yet more preferably ≥40 $J/m^2$. Such differences in adhesion energy allows for easier release of the semiconductor wafer from the temporary bonding layer as compared to the carrier substrate.

Figure 2E:
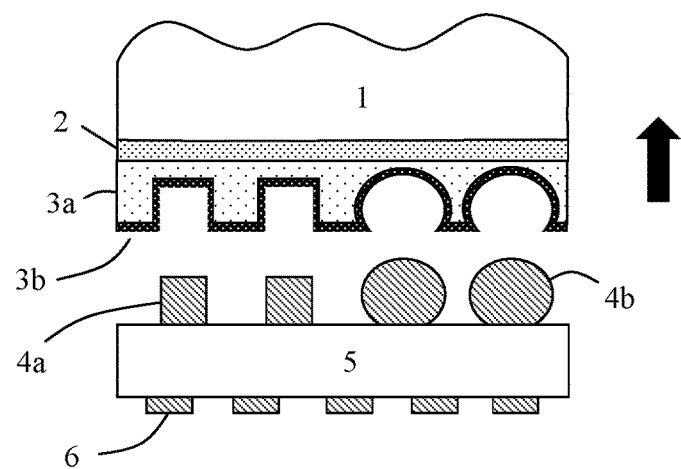

After completion of the operations to be performed on the semiconductor wafer, the wafer is then separated from the carrier substrate and the temporary bonding layer. Any suitable method for separating the semiconductor wafer from the temporary bonding layer may be used, such as those disclosed in U.S. Pat. App. Pub. Nos. 2010/0263794; 2011/0308739; and 2012/0028438, and Int. Pat. App. No. WO 2011/079170. The structure may optionally be heated in order to facilitate separation of the semiconductor wafer, but such heating is not required. An advantage of the present invention is that with such low adhesion energy between the temporary bonding layer and the semiconductor wafer, separation is easily achieved by forcing a wedge between the semiconductor wafer and the carrier substrate to force or pry apart the structure. Once separation initiates, the semiconductor wafer is easily separated from the temporary bonding layer. FIG. 2E illustrates one aspect of the invention showing processed semiconductor wafer 5 having interconnect features shown as metal pillars 4a and solder bumps 4b on the front side and conductive contacts 6 on the back side separating from carrier substrate 1 having optional adhesion promoter layer 2, and both regions 3a and 3b of the temporary bonding layer. The processed semiconductor wafer 5 is then rinsed with an appropriate solvent or solvent mixture to remove any residue, and then dried. Suitable rinse agents include, without limitation, isopropanol, acetone, mesitylene, ammonia/water, water/surfactant, and the like.

Figure 2F:
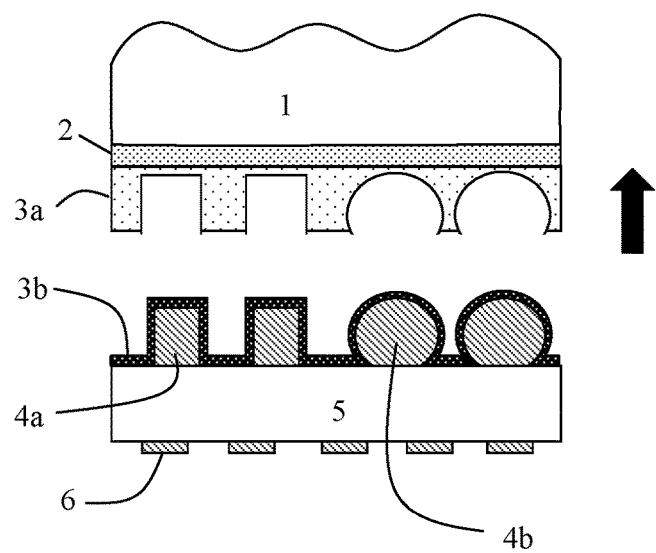

FIG. 2F illustrates an alternate aspect where region 3b remains on the front side of the semiconductive wafer following separation, which is then easily removed by contacting semiconductor wafer 5 with an appropriate solvent or solvent mixture followed by drying. As illustrated in FIGS. 2E and 2F, the present temporary bonding layer is able to be removed from the surface of a semiconductive wafer, even from areas having topographic features such as metal pillars and solder bumps, leaving little to no cured adhesive material residue.

Certain interconnect features, such as solder bumps and pillars present challenges in removing any temporary bonding layer due to their size and shape of the features, as well as the relative density of such features in a given area. This leads to an increase in surface area and in the case of C4 bumps, a reentrant profile near the wafer surface. The reentrant profile or overhang significantly increase the difficulty for low energy debonding of the adhesive. Accordingly, higher amounts of release additive may be required in the present temporary bonding compositions in order to ensure good release of a semiconductor wafer having these interconnect features. Higher amounts of release additive will result in a larger region (3b in FIG. 2B) that predominantly comprises the release additive adjacent to the front side of the semiconductor wafer, which will facilitate separation of the wafer in areas having such topographic features. The compatibilizers of the present invention enable higher amounts of release additive to be used. In addition, the compatibilizers also function to reduce the elastic modulus of the cured adhesive material, thereby making the cured adhesive material more pliable and easier to remove from various interconnect features.

Semiconductor Wafer Coating:

Silicon wafers were coated on a Site Service Tractrix spin-coating system with an integrated hot plate and wafer transfer system. An amount (6-8 g) of a sample was disposed on an untreated silicon wafer using a dynamic dispense and a spin speed of 1000 to 2000 rpm for up to 45 seconds, followed by soft bake at 120° C. for 90 seconds on a hot plate. The final coating thickness was inversely dependent on spin speed and ranged from 25 to 50 μm.

Carrier Substrate Coating:

Unless other wise specified, carrier wafers were prepared for the bonding study by treating the wafer surface with a poly(alkoxysilane) adhesion promoter (AP-9000S™ Adhesion Promoter available from Dow Electronic Materials) to enhance adhesion of the temporary bonding layer after cure. The adhesion promoter was applied using a spin-coater with a static dispense followed by spinning at 2000 rpm for 45 seconds and a hot plate bake step at 120° C. for 2 minutes.

Semiconductor Wafer to Carrier Substrate Bonding:

Two silicon wafer pieces, one having a layer of temporary bonding composition disposed thereon, were bonded by heating on a hot plate placing in direct contact and then attaching a clamp to prevent the parts from sliding apart. Alternatively, the wafers were bonded in a vacuum laminator. The samples were then cured in a rapid thermal annealing chamber or nitrogen furnace at 210° C. for 1 hour.

Single Cantilever Beam Adhesion Test:

Parts to be evaluated were attached to a load cell and then the semiconductor wafer and carrier substrate were separated at a slow rate by applying a wedge open stress, according to the method described in S. Chauffaille, et al., "Pre-Cracking Behaviour in the Single Cantilever Beam Adhesion Test," Int. J. Fract (2011) 169: 133-144.

EXAMPLE 1

Various samples were prepared by combining DVS-bisBCB oligomer (as curable adhesive material, "AM") solution in dipropylene glycol dimethyl ether (from The Dow Chemical Company), an ethyleneoxide-butyleneoxide-ethyleneoxide triblock polymer having a $M_n$ of 6700 (as release additive, "RA") available from The Dow Chemical Company under the FORTEGRA™ brand, and a polybutyleneoxide monoethyl ether having an average of 12 butyleneoxide units (as compatibilizer, "C"), along with additional dipropylene glycol dimethyl ether (as solvent), in the amounts shown in Table 1. The samples were mixed using magnetic stir bar at 80° C. until complete dissolution (typically 10 min). A portion of each sample was placed in a cuvette, the cuvette was then placed on a lighted surface at 20° C., and visually inspected. The results are reported in Table 1.

TABLE 1

| | Sample | | | | | | |
|---|---|---|---|---|---|---|---|
| | Control 1 | Control 2 | 1 | 2 | 3 | 4 | 5 |
| AM (wt %) | 62 | 59 | 55 | 49 | 52 | 49 | 46 |
| RA (wt %) | 5 | 10 | 10 | 10 | 15 | 15 | 20 |
| C (wt %) | 0 | 0 | 5 | 15 | 5 | 10 | 10 |
| Solvent | 33 | 31 | 30 | 26 | 28 | 26 | 24 |
| Visual Inspection | Clear | Turbid | Clear | Clear | Turbid | Clear | Very turbid |

The above data show that the Control 1 sample, which contains 5 wt % of the release additive is clear, but increasing the amount of the release additive to 10 wt % forms a very turbid sample (Control 2). Sample 1 shows that adding 5 wt % of compatibilizer to a sample containing 10 wt % of the release additive results in a clear, that is compatible, sample. The results in Table 1 clearly demonstrate that the amount of the release additive effectively loaded into the temporary bonding compositions of the invention is enhanced with the use of a compatibilizer of the invention.

EXAMPLE 2

The procedure of Example 1 was repeated except that polybutyleneoxide monododecylphenyl ether having a $M_n$ of 1800 was used as the compatibilizer ("C"). The amounts of components in the samples and the visual inspection results are reported in Table 2. These results show that the use of a compatibilizer of the invention increases the amount of the release additive that can be used in the present temporary bonding compositions.

TABLE 2

| | Sample | | | | | |
|---|---|---|---|---|---|---|
| | Control 3 | 6 | 7 | 8 | 9 | 10 |
| AM (wt %) | 59 | 52 | 49 | 46 | 36 | 33 |
| RA (wt %) | 10 | 10 | 10 | 10 | 10 | 15 |
| C (wt %) | 0 | 10 | 15 | 20 | 35 | 35 |
| Solvent | 31 | 28 | 26 | 24 | 19 | 17 |
| Visual Inspection | Turbid | Turbid | Clear | Clear | Clear | Very turbid |

EXAMPLE 3

The procedure of Example 1 was repeated except that a different compatibilizer was used for each of Samples 11 to 15 in a constant weight ratio of adhesive material:release additive:compatibilizer of 62:8:30. The following compatibilizers were used: A=polybutyleneoxide monobutyl ether having a $M_n$ of 750; B=polybutyleneoxide monobutyl ether having a $M_n$ of 1000; C=polybutyleneoxide monobutyl ether having a $M_n$ of 1500; D=polybutyleneoxide monobutyl ether having a Mw of 2000; and E=polybutyleneoxide monododecylphenyl ether having a $M_n$ of 1800. The control sample contained no compatibilizer and had a weight ratio of adhesive material:release agent of 92:8. The results of the visual inspection are reported in Table 3.

TABLE 3

| | Sample | | | | | |
|---|---|---|---|---|---|---|
| | Control 4 | 11 | 12 | 13 | 14 | 15 |
| Compatibilizer | None | A | B | C | D | E |
| Visual inspection | Very turbid | Clear | Very slight turbidity | Very slight turbidity | Slight turbidity | Very slight turbidity |

EXAMPLE 4

Four samples were prepared by combining DVS-bisBCB oligomer (as curable adhesive material, "AM") solution in dipropylene glycol dimethyl ether, an ethyleneoxide-butyleneoxide-ethyleneoxide triblock polymer having a $M_n$ of 6700 (as release additive, "RA") available from The Dow Chemical Company under the FORTEGRA™ brand, polybutyleneoxide monododecylphenyl ether having a $M_n$ of 1800 (as compatibilizer, "C"), and a phenolic antioxidant (IRGANOX™ 1010, "Antiox"), along with additional dipropylene glycol dimethyl ether (as solvent), in the weight ratios shown in Table 4. The sample Comparative 1 did not contain any release additive.

TABLE 4

| Sample | Comparative 1 | Control 5 | 16 | 17 |
|---|---|---|---|---|
| AM:RA:C:Antiox | 83:0:16:1 | 91:8:0:1 | 75:8:16:1 | 61:8:30:1 |
| Modulus (GPa) | 3.39 | 2.66 | 2.07 | 1.27 |
| Adhesion to Wafer | High | Releasable | Releasable | Releasable |
| Adhesion to Carrier | High | High | High | High |

A commercial adhesion promoter was spin coated on the attachment surface of a segment of 100 mm wafer (2000 rpm), followed by a soft bake at 120° C. for 90 seconds, and then followed by cooling. Next, the sample was spin coated (1000 rpm) on a segment of 100 mm wafer, soft baked at 120° C. for 2 min, cooled for 2 min, and then followed by a second coating using the same procedure to form a doubly coated layer of a temporary bonding composition on the device wafer. The carrier wafer was then vacuum laminated to the temporary bonding composition at 120° C. for 60 seconds. The laminated wafers were then cured by heating on an oven for 1 hour at 210° C. in a nitrogen atmosphere. Following curing, the Control 5, Sample 16 and Sample 17 wafer pairs were successfully debonded by manual release of the wafer pairs. The greasy surface of the adhesives on the wafer with the adhesion promoter was rinsed with isopropanol and dried under ambient condition before modulus measurement. The Comparative 1 sample adhered well to the wafer pair, and the wafer pair could not be debonded using manual release. The wafer pair was then broken upon dicing and a piece of the adhesive on a single wafer was used for modulus measurement. The modulus of the adhesives was measured by microindentation using a Fisherscope HM2000 XYp indenter equipped with a Berkovich tip.

The four sample adhesives were also prepared separately on wafers with and without the adhesion promoter. The commercial adhesion promoter was spin coated on the attachment surface of a segment of 100 mm wafer (2000 rpm), followed by a soft bake at 120° C. for 90 seconds, and then followed by cooling. Next, the sample was spin coated (1000 rpm) separately on a segment of 100 mm wafer with and without the adhesion promoter, soft baked at 120° C. for 2 min, and cooled to form a layer of a temporary bonding composition on the carrier wafer and the device wafer, respectively. The samples were then cured by heating in an oven for 1 hour at 210° C. in a nitrogen atmosphere. After curing, a spatula with a sharp tip was used to delaminate the adhesives from the substrates. The Control 5, Sample 16 and Sample 17 adhesives on the wafer without the adhesion promoter could be easily delaminated, while the adhesives adhered well to the wafer with the adhesion promoter and showed cohesive failure without delamination if the adhesive was scratched by the spatula.

The Comparative 1 sample, which did not contain any release additive but did contain a 16% of compatibilizer of the invention, and was found to strongly adhere to both the device wafer and the carrier, demonstrating that the present compatibilizers do not function as release additives. Samples 16 and 17, both of which contained compatibilizer in addition to release additive, showed significantly reduced modulus as compared to either the Comparative 1 or Control 5 samples.

EXAMPLE 5

The procedure of Example 4 was repeated except that Samples 11 to 15 from Example 3 were used. The results are reported in Table 5.

TABLE 5

| Sample | 11 | 12 | 13 | 14 | 15 |
|---|---|---|---|---|---|
| Compatibilizer | A | B | C | D | E |
| Modulus (GPa) | 3.3 | 2.2 | 1.4 | 0.9 | 1.27 |
| Adhesion to Wafer | Releasable | Releasable | Releasable | Releasable | Releasable |

TABLE 5-continued

| Sample | 11 | 12 | 13 | 14 | 15 |
|---|---|---|---|---|---|
| Adhesion to Carrier | High | High | High | High | High |

EXAMPLE 6

Adhesion to Semiconductor Wafer with Solder Bumps

The function of the release additive is to reduce the adhesion between the cured adhesive material and the semiconductor. In many applications, the semiconductor is coated with an array of interconnect structures such as copper pillars or solder bumps. The adhesion to these structures surfaces can be quantified in terms of the critical strain energy release rate, $G_C$, of the respective interfaces. The method employed here was the single cantilever beam method. The critical strain energy release rate, $G_C$, is related to load and fracture ($P_C$), the crack length (a), the beam thickness (h), the beam width (B), and the beam plain strain elastic modulus (E'):

$$G_C = \frac{6a^2 P_C^2}{E' h^3 B^2}.$$

The adhesion of two samples to a semiconductor surface with a dense array of 90 μm solder balls was compared. In the first sample (Control 6), two diols, ethyleneoxide-butyleneoxide-ethyleneoxide triblock copolymer having a $M_n$ of 6700 and poly(tetramethylene glycol), having a molecular weight of 2900, (available as PolyTHF 2900, from BASF) were used as the release additives at solids amount of 8% and 12%, respectively, in DVS-BCB which was as the adhesive material. The adhesion to the bumped surface was determined to be 16.9 J/m², too high to successfully debond from a full sized wafer. In the second sample (Sample 18), ethyleneoxide-butyleneoxide-ethyleneoxide triblock copolymer having a $M_n$ of 6700 was used as the release additive at 8% solids and polybutyleneoxide monododecylphenyl ether having a $M_n$ of 1800 was used as the compatibilizer at 30% solids in DVS-BCB, which was used as the adhesive material. The adhesion of a layer of Sample 18 to the bumped wafer surface was determined to be only 4.6 J/m², which is a significant reduction in energy needed to remove the semiconductor wafer from the cured adhesive layer.

EXAMPLE 7

A coating composition was prepared by combining 356.15 g of 68.5% DVS-bisBCB oligomer (having a molecular weight (Mw) of 25,000-30,000) in Proglyde™ DMM, 24.5 g of ethyleneoxide-butyleneoxide-ethyleneoxide triblock polymer having a $M_n$ of 6700 as the release additive, 49 g of polybutyleneoxide monododecylphenyl ether having a $M_n$ of 1800 was used as the compatibilizer, and 1.5 g of a phenolic antioxidant (Irganox™ 1010). The composition was manually mixed with a wooden stick, heated to 50° C. for approximately 1 hour, and then rolled until homogeneous.

200 mm silicon wafers were subjected to an oxygen plasma etch for 10 seconds. Next, a commercial adhesion promoter was spin coated on the attachment surface of a carrier wafer (2000 rpm), followed by a soft bake at 120° C. for 90 seconds, and then followed by cooling. Next, the coating composition was spin coated (2000 rpm) on a device wafer, soft baked at 120° C. for 90 seconds, cooled for 30 seconds, and soft baked at 160° C. for 120 seconds to form a layer of a temporary bonding composition on the device wafer. The carrier wafer was then vacuum laminated to the temporary bonding composition at 80° C. for 60 seconds, with vacuum applied for 45 seconds and pressure applied for 60 seconds. The laminated wafers were then cured by heating on a hot plate, device side down, for 120 seconds at 210° C., in a nitrogen atmosphere. The thickness of the cured temporary bonding layer was approximately 32 µm. Following curing, the wafers were successfully debonded with a razor blade inserted near a notch and guided around the wafer. What residue remained on the device wafer was easily removed by rinsing with acetone.

EXAMPLE 8

The procedure of Example 7 was repeated using the following composition: 89.04 g of 68.5% DVS-bisBCB oligomer (having a molecular weight (Mw) of 25,000-30,000) in PROGLYDE™ DMM as adhesive material, 44.52 g of 90/10 styrene:diallyl maleate oligomer as adhesive material, 6.13 g of ethyleneoxide-butyleneoxide-ethyleneoxide triblock polymer having a $M_n$ of 6700 as the release additive, 12.25 g of polybutyleneoxide monododecylphenyl ether having a $M_n$ of 1800 was used as the compatibilizer, and 0.38 g of a phenolic antioxidant (IRGANOX™ 1010). The coating composition contained DVS-bisBCB oligomer and styrene:diallyl maleate oligomer in a weight ratio of 1:1. The thickness of the cured temporary bonding layer from this composition was approximately 26 µm. Following curing, the wafers were successfully debonded with a razor blade inserted near a notch and guided around the wafer. No residue was visible on the device wafer after debonding.

EXAMPLE 9

The procedure of Example 7 was repeated except that the DVS-bisBCB oligomer was replaced with 356.15 g of 90/10 styrene:diallyl maleate oligomer in PROGLYDE™ DMM solvent (68.5% solids). This coating composition contained no DVS-bisBCB oligomer. The thickness of the cured temporary bonding layer from this composition was approximately 31 p.m. Following curing, the wafers were successfully debonded with a razor blade inserted near a notch and guided around the wafer.

EXAMPLE 10

The procedure of Example 3 was repeated except that the following compatibilizers were used: F=poly(butyleneoxide-propyleneoxide)mono dodecyl ether having a $M_n$ of 505; G=poly(butyleneoxide-propyleneoxide)mono dodecyl ether having a $M_n$ of 1500; H=poly(butyleneoxide-propyleneoxide)mono dodecyl ether having a $M_n$ of 3000; and I=poly(butyleneoxide-propyleneoxide)mono dodecyl ether having a $M_n$ of 4800. The weight ratio of adhesive material:release additive:compatibilizer was 62:8:30 (Samples 18-21) or 72:8:20 (Samples 22-25). The results are shown in Table 6.

EXAMPLE 11

The procedure of Example 4 was repeated except that Samples 18 to 25 from Example 10 were used. Each sample had a high adhesion to the carrier, and was releasable from the wafer. The results are reported in Table 6.

TABLE 6

| | Sample | | | | | | | |
|---|---|---|---|---|---|---|---|---|
| | 18 | 19 | 20 | 21 | 22 | 23 | 24 | 25 |
| Compatibilizer | F | G | H | I | F | G | H | I |
| Visual inspection | Clear | Clear | Clear | Clear | Clear | Clear | Clear | Clear |
| Modulus (GPa) | 3.7 | 2.2 | 1.9 | 1.1 | 3.2 | 2.5 | 2.3 | 1.2 |

What is claimed is:

1. A temporary bonding composition comprising a curable adhesive material, a polyether release additive, and a compatibilizer, wherein the release additive is free of silicon.

2. The composition of claim 1 wherein the curable adhesive material is chosen from polyarylene oligomers, cyclicolefin oligomers, arylcyclobutene oligomers, vinyl aromatic oligomers, and mixtures thereof.

3. The composition of claim 1 wherein the release additive is chosen from polyalkylene oxide homopolymers or polyalkylene oxide copolymers.

4. The composition of claim 1 wherein the release additive contains one or more polar end groups chosen from alkoxy, aryloxy, hydroxy, carboxylate, alkoxycarbonyl, mercapto, alkylthio, primary amine, secondary amine, and tertiary amine.

5. The composition of claim 1 wherein the compatibilizer is a polyether comprising butylene oxide units.

6. The composition of claim 5 wherein the compatibilizer is a polybutyleneoxide having the formula $R^{14}$—O—$(C_4H_8O)_z$—$(C_3H_6O)_y$—$R^{15}$; wherein each of $R^{14}$ and $R^{15}$ is independently chosen from H, $(C_1\text{-}C_{20})$alkyl, H—$(R^{16}O)_w$—$R^{17}$, or $(C_6\text{-}C_{20})$aryl; each $R^{16}$ and $R^{17}$ are independently $(C_1\text{-}C_6)$alkylidene; w is an integer from 1 to 5; z is an integer from 5 to 250, and y is an integer from 0 to 200.

7. The composition of claim 1 wherein the release additive and the combatilizer are in a weight ratio of 5:1 to 1:5.

8. The composition of claim 1 wherein the release additive phase separates from the adhesive material during curing of the adhesive material.

9. The composition of claim 1 wherein the compatibilizer lowers an elastic modulus of the cured adhesive material, as compared to when no compatibilizer is used.

10. The composition of claim 1 wherein the compatibilizer does not phase separate from the from the adhesive material during curing of the adhesive material.

11. The composition of claim 1 wherein the compatibilizer increases the amount of the release additive that can be dissolved or dispersed in the adhesive material as compared to when no compatibilizer is used.

12. The composition of claim 1 wherein the compatibilizer does not phase separate from the from the adhesive material during curing of the adhesive material.

13. The composition of claim 1 further comprising an organic solvent.

14. The composition of claim 13 wherein the curable adhesive material is present in an amount of 50 to 99 wt %, the polyether release additive is present in an amount of 1 to 50 wt %, and the compatibilizer is present in an amount of 1 to 40 wt %.

15. A structure comprising: a semiconductor wafer having a front side and a back side; a carrier substrate having an attachment surface; and a temporary bonding layer disposed between the front side of the semiconductor wafer and the attachment surface of the carrier substrate; wherein the temporary bonding layer comprises a cured adhesive material, a compatibilizer and a polyether release additive, the release additive being free of silicon; wherein the temporary bonding layer is composed of a first region adjacent to the attachment surface of the carrier substrate having a relatively lower amount of release additive and a second region adjacent to the front side of the semiconductor wafer having a relatively greater amount of release additive.

16. The structure of claim 15 wherein the cured adhesive material is a cured arylcyclobutene adhesive material.

17. The structure of claim 16 wherein the cured adhesive material has a modulus of >1 GPa and an elongation of <20% at a breaking point.

18. The structure of claim 15 having a lower adhesion energy between the front side of the semiconductor wafer and the temporary bonding layer as compared to an adhesion energy between the attachment surface of the carrier substrate and the temporary bonding layer.

* * * * *